(12) United States Patent
Yu et al.

(10) Patent No.: US 7,989,774 B2
(45) Date of Patent: Aug. 2, 2011

(54) RADIATION DETECTOR

(75) Inventors: Juhyun Yu, Mito (JP); Yoshinori Sunaga, Hitachinaka (JP); Hidetaka Kawauchi, Hitachi (JP); Shinichi Inoue, Ryugasaki (JP); Isao Takahashi, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 67 days.

(21) Appl. No.: 12/458,200

(22) Filed: Jul. 2, 2009

(65) Prior Publication Data
US 2010/0200764 A1 Aug. 12, 2010

(30) Foreign Application Priority Data
Feb. 12, 2009 (JP) ................ 2009-029668

(51) Int. Cl.
*G01T 1/24* (2006.01)
(52) U.S. Cl. ................. 250/370.1
(58) Field of Classification Search ........... 250/370.01, 250/370.09, 370.13, 370.14; 257/53, 184, 257/188, 222, 225, 428, 431, 442; 438/56, 57, 63, 74
See application file for complete search history.

(56) References Cited

U.S. PATENT DOCUMENTS

| | | | |
|---|---|---|---|
| 5,291,019 A * | 3/1994 | Powell et al. | 250/338.4 |
| 6,236,051 B1 | 5/2001 | Yamakawa et al. | |
| 7,208,740 B2 * | 4/2007 | El-Hanany et al. | 250/370.09 |
| 7,381,073 B2 * | 6/2008 | Yokoi et al. | 439/267 |
| 7,488,949 B2 * | 2/2009 | Ueno et al. | 250/370.15 |
| 7,541,593 B2 * | 6/2009 | Yanagita et al. | 250/370.08 |
| 2006/0065848 A1 * | 3/2006 | Ueno et al. | 250/370.15 |

* cited by examiner

*Primary Examiner* — David P Porta
*Assistant Examiner* — David S Baker
(74) *Attorney, Agent, or Firm* — McGinn IP Law Group, PLLC

(57) ABSTRACT

A radiation detector includes a semiconductor element capable of detecting a radiation, a substrate on which the semiconductor element is mounted, and a flexible substrate including a connection pattern connected to an element electrode on an opposite side to the substrate of the semiconductor element. The semiconductor element is disposed on one surface of the substrate, and the flexible substrate is disposed on the opposite side to the substrate of the semiconductor element.

10 Claims, 14 Drawing Sheets

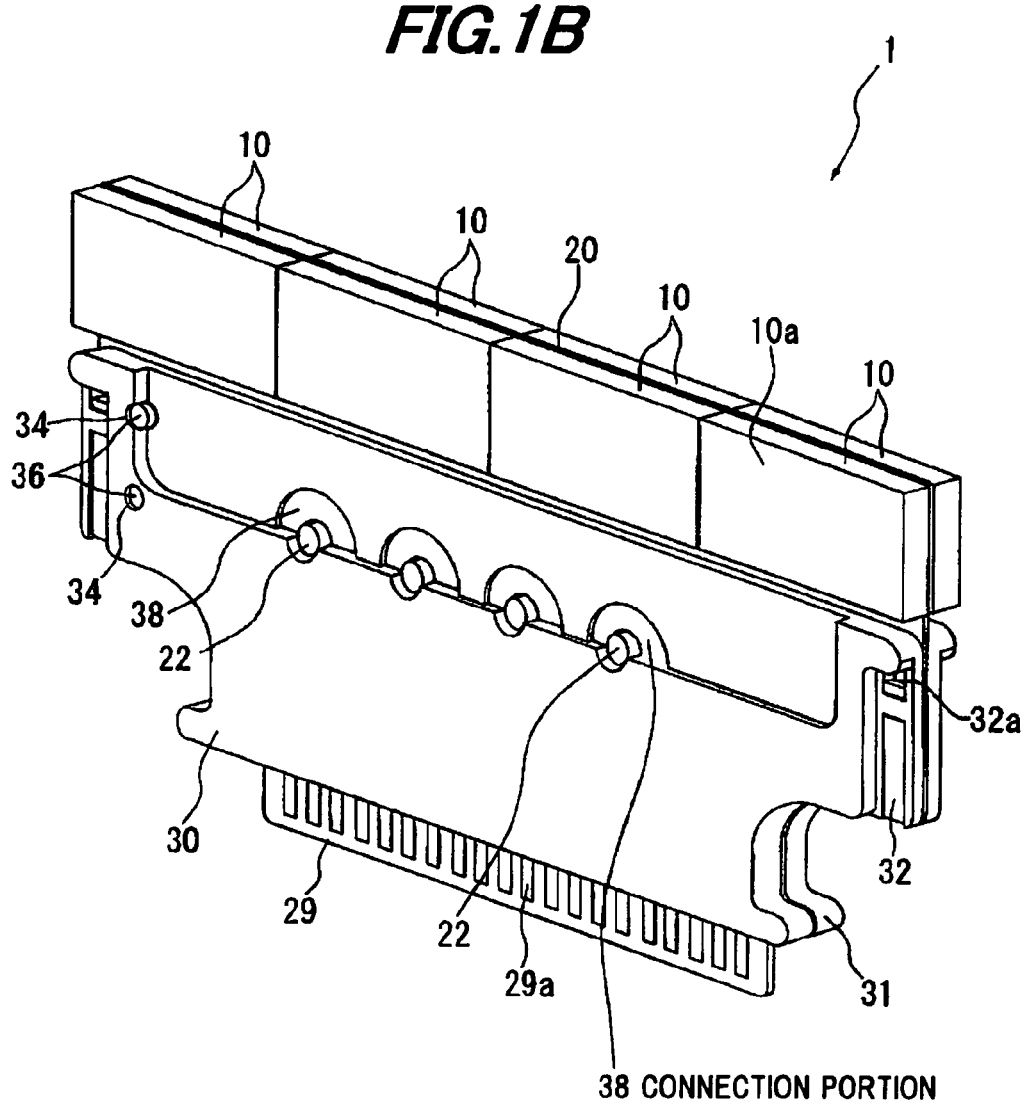

| 20a ELEMENT CONNECTING PORTION |
| 26 ELECTRONIC PARTS MOUNTING PORTION |

50 CONDUCTIVE ADHESIVE

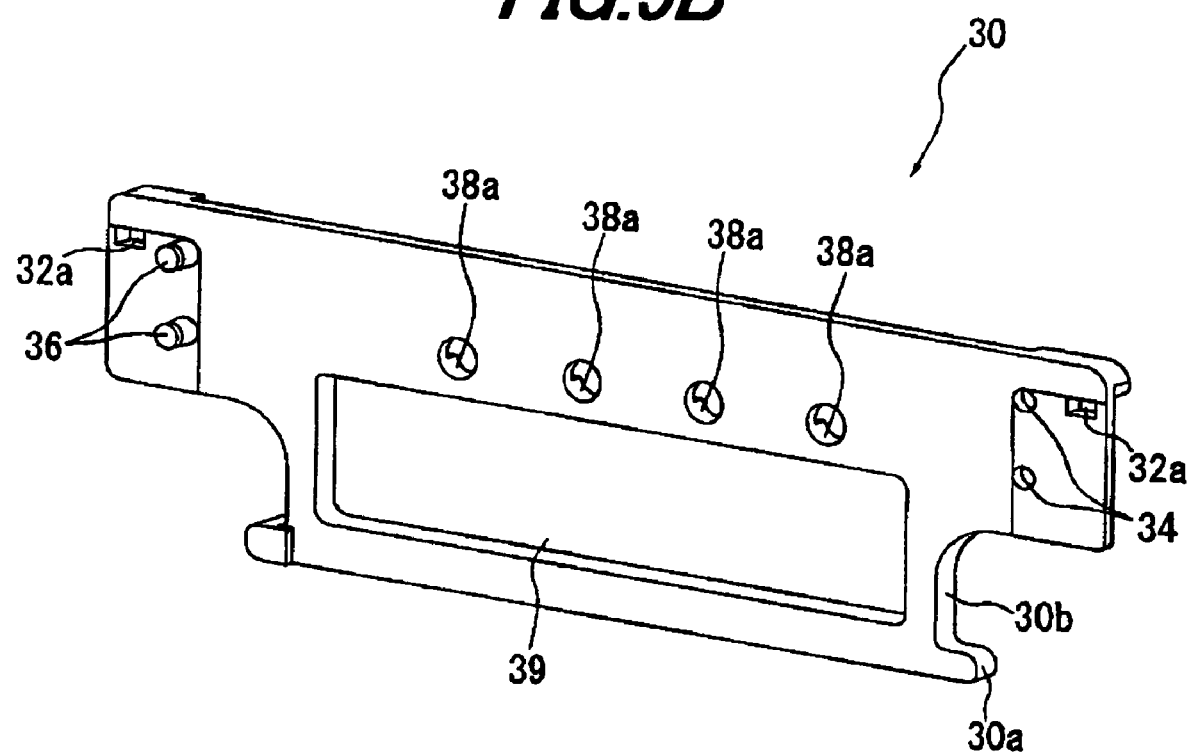

RADIATION DETECTOR

The present application is based on Japanese patent application No. 2009-029668 filed on Feb. 12, 2009, the entire contents of which are incorporated herein by reference.

BACKGROUND OF THE INVENTION

1. Field of the Invention

This invention relates to a radiation detector and, in particular, to a radiation detector used in a radiation detector assembly for detecting a radiation such as γ-ray, X-ray etc.

2. Description of the Related Art

A conventional radiation detector is constructed such that a laminated body composed of multiple common electrode plates, multiple semiconductor cells and multiple electrode plates, where the laminated body is arranged as the common electrode plate, the semiconductor cell, the electrode plate, the common electrode plate, . . . , is disposed between two frames, and one frame is pin-fixed to the other frame (see, e.g., U.S. Pat. No. 6,236,051).

The radiation detector in U.S. Pat. No. 6,236,051 can reduce the region not capable of detecting radiation to enhance the detection efficiency of radiation since a pair of the semiconductor cells neighboring in the lateral direction share the common electrode plate.

However, the radiation detector in U.S. Pat. No. 6,236,051 has the problem that the distance between the semiconductor cells is difficult to strictly control to have a predetermined distance upon arranging in high density the multiple semiconductor cells since the radiation detector is constructed by the multiple components such as the common electrode plates and the semiconductor cells and dimension errors caused by the respective components are accumulated when the components are laminated. In addition, since the radiation detector in U.S. Pat. No. 6,236,051 is constructed by fastening two frames with pins, it is difficult to evenly apply the fastening pressure to the semiconductor cells so that the semiconductor cells and a single electrode plate may not be properly connected and, if fastened too strong, a mechanical stress may be applied to the semiconductor cells.

SUMMARY OF THE INVENTION

It is an object of the invention to provide a radiation detector that allows high-density arrangement of multiple semiconductor cells in a radiation detector assembly and high reliability thereof.

(1) According to one embodiment of the invention, a radiation detector comprises:
   a semiconductor element capable of detecting a radiation;
   a substrate on which the semiconductor element is mounted; and
   a flexible substrate comprising a connection pattern connected to an element electrode on an opposite side to the substrate of the semiconductor element,
   wherein the semiconductor element is disposed on one surface of the substrate, and
   the flexible substrate is disposed on the opposite side to the substrate of the semiconductor element.

In the above embodiment (1), the following modifications, changes and a combination thereof can be made.

(i) The flexible substrate further comprises a flexible base film, and an insulating film formed on the base film, and
   the connection pattern is formed between the base film and the insulating film.

(ii) The radiation detector further comprises an other semiconductor element disposed between the semiconductor element and the substrate and connected to one surface of the substrate.

(iii) The radiation detector further comprises a double-side patterned flexible substrate between the semiconductor element and the other semiconductor element, the double-side patterned flexible substrate comprising connection patterns formed on both sides thereof and connected to the semiconductor element and the other semiconductor element, respectively.

(iv) The substrate further comprises a card edge on a side of a second end opposite a first end of the substrate for mounting the semiconductor element such that it can be connected to an external electric circuit.

(v) The radiation detector is used for a radiation detector assembly that a plurality of the radiation detectors are arrayed.

(vi) The radiation detector comprises a plurality of semiconductor elements mounted on the substrate, and
   the plurality of semiconductor elements are arranged on one surface and an other surface of the substrate such that they are plane-symmetrical with respect to the substrate.

(vii) The substrate has substantially a same thickness as or a thickness less than a thickness of a wall separating a plurality of apertures of a collimator.

(viii) The semiconductor element comprises a plurality of pixels for detecting a radiation.

Points of the Invention

In the radiation detector of the embodiment according to the invention, the element electrode of the semiconductor elements on the opposite side to the substrate is electrically connected to terminals on the substrate via the wiring pattern (connection pattern) on the flexible substrate. Thus, the semiconductor elements each can be easily bonded to the wiring pattern of the flexible substrate by a conductive adhesive without applying stress to the terminals on the substrate. Only by pressing the region corresponding to the semiconductor element, all of the semiconductor elements and the wiring patterns can be properly connected while preventing variation in shape such as unevenness.

BRIEF DESCRIPTION OF THE DRAWINGS

The preferred embodiments according to the invention will be explained below referring to the drawings, wherein:

FIG. 1B is a perspective view showing the radiation detector of the embodiment without a flexible substrate;

FIG. 5B is a perspective view (viewed from the back side) showing the card holder of the embodiment;

DETAILED DESCRIPTION OF THE PREFERRED EMBODIMENTS

First Embodiment

Figure 1A:
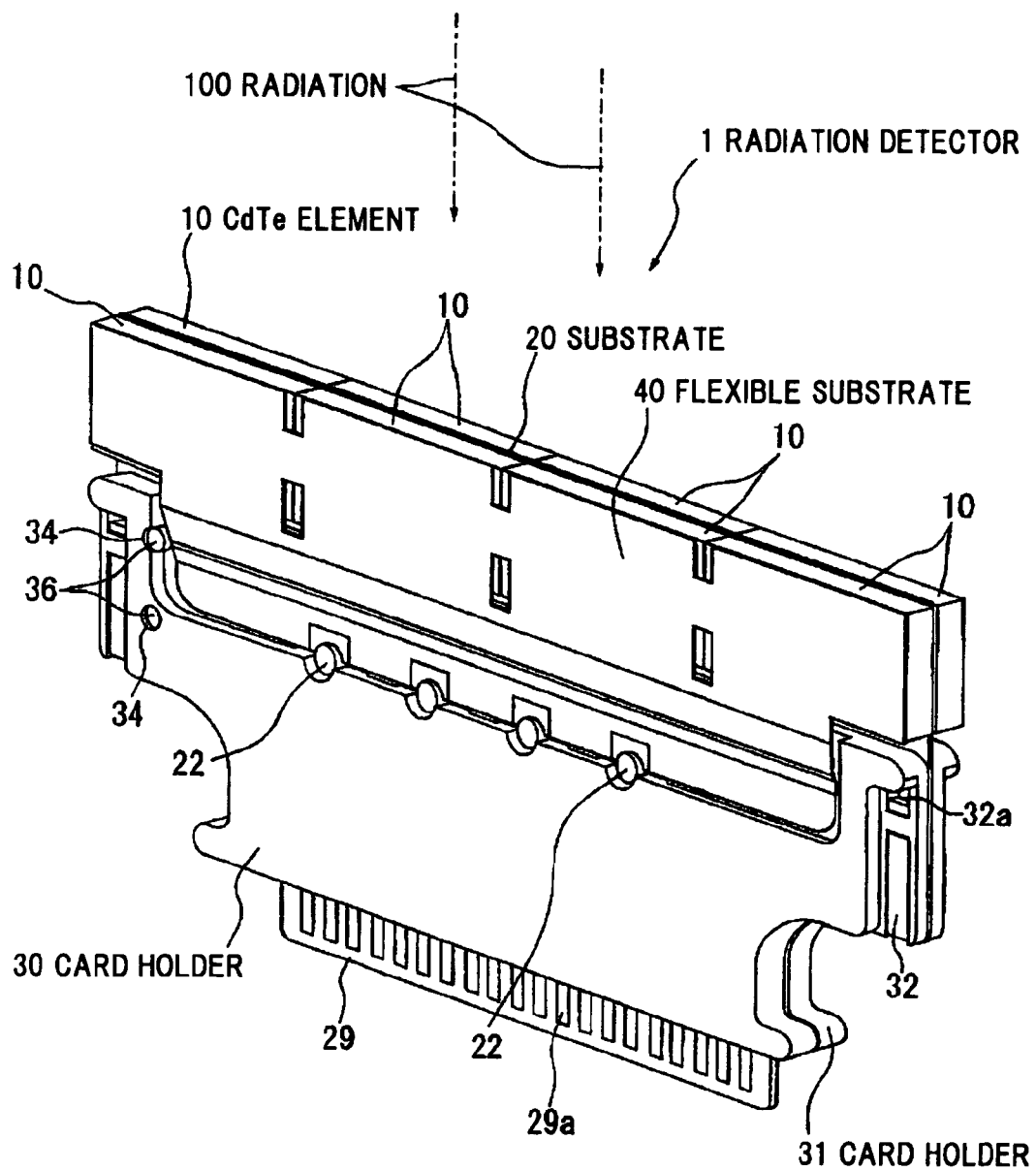
FIG. 1A is a perspective view showing a radiation detector in a preferred embodiment according to the invention.
Figure 1C:
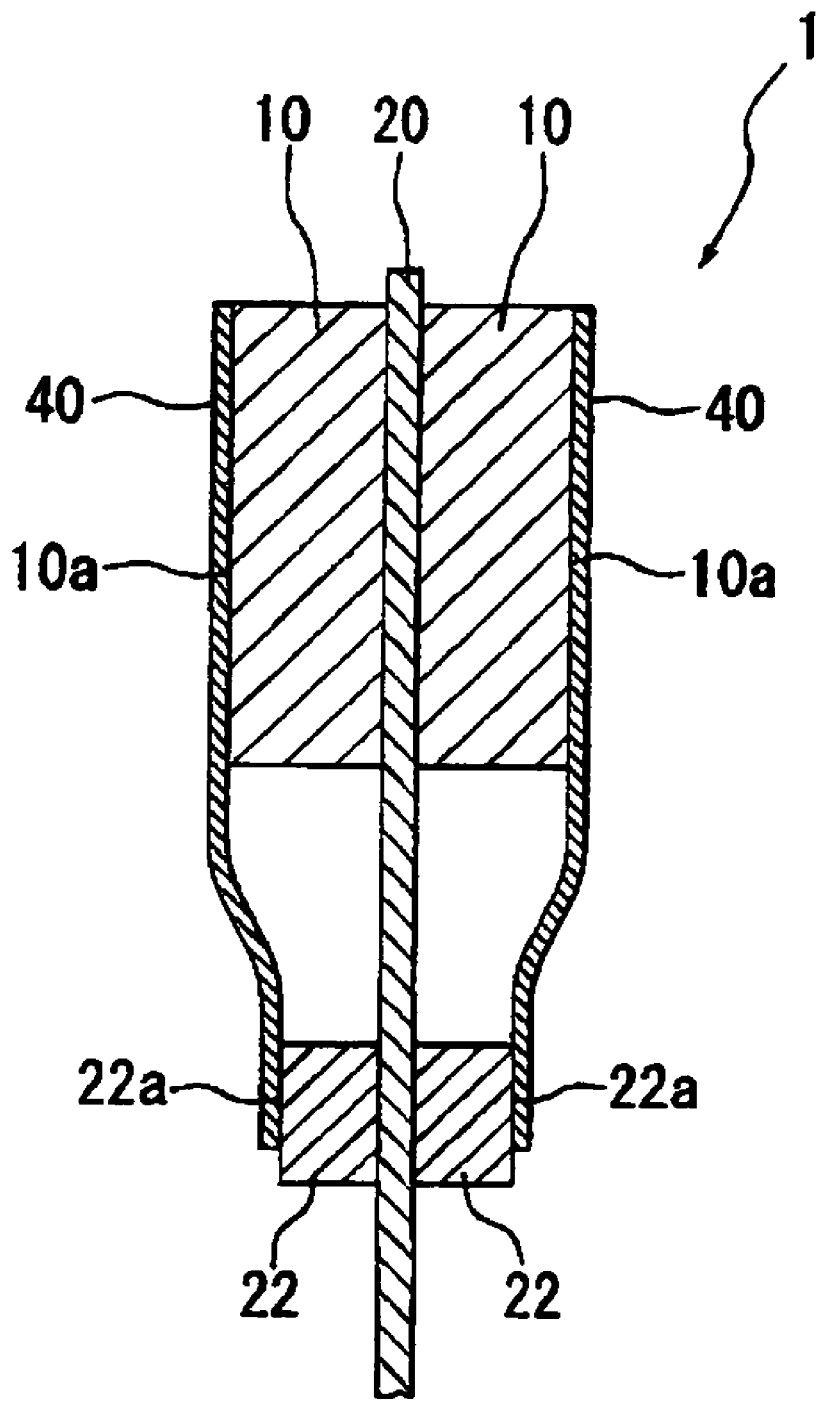
FIG. 1C is a cross sectional view showing the radiation detector of the embodiment.

FIG. 1A is a perspective view showing a radiation detector in the preferred embodiment according to the invention. FIG. 1B is a perspective view showing the radiation detector of the embodiment without a flexible substrate. FIG. 1C is a cross sectional view showing the radiation detector of the embodiment. For convenience of explanation, a card holder 30 and a card holder 31 are omitted in FIG. 1C.

Composition of Radiation Detector 1

The radiation detector 1 of the embodiment is a radiation detector for detecting a radiation such as γ-ray, X-ray etc. As shown in FIG. 1A, a radiation 100 propagates downward from above on the sheet. Namely, the radiation 100 propagates in the direction from the semiconductor element to the card holder of the radiation detector 1 upon reaching the radiation detector 1. In the radiation detector 1, a CdTe element 10 as a semiconductor element detects the radiation 100 at its side face (i.e., its top surface as shown in FIG. 1A). Thus, the side face of the CdTe element corresponds to an incident surface for the radiation 100. In this embodiment, the radiation detector with the side face of the semiconductor element used to input the radiation 100 is called an edge-on type radiation detector. The radiation detector 1 may be constructed as a radiation detector for an edge-on type radiation detector composed such that plural radiation detectors 1 are arranged to detect a radiation 100 through a collimator with multiple apertures for passing the radiation 100 propagating in a specific direction (e.g., a direction from a detected sample to the radiation detector 1). The radiation detector 1 of the embodiment is shaped as a card type radiation detector.

The radiation detector 1 of the embodiment may be fitted with a collimator. Alternatively, the radiation detector 1 may be used without the collimator. In case of using the collimator, a multihole collimator, a pinhole collimator etc. can be used. In this embodiment, for example, the radiation detector fitted with the multihole collimator will be explained below.

Referring to FIG. 1A, the radiation detector 1 is composed of a pair of CdTe elements 10 as a semiconductor element capable of detecting a radiation 100 through multiple apertures of the collimator, a thin substrate 20 with substantially the same thickness as or a thickness less than a wall for separating the apertures of the collimator, and a card holder 30 and a card holder 31 as a support member for supporting the substrate 20 by sandwiching the substrate 20 at a position adjacent to the pair of CdTe elements 10. In the embodiment, four pairs of CdTe elements 10 are fixed to the substrate 20 at positions for sandwiching the substrate 20. A pair of CdTe elements 10 are each fixed to one surface and the other surface of the substrate 20 such that they are positioned plane-symmetrical with respect to the substrate 20 as a symmetry plane.

Though detailed later, the substrate 20 is sandwiched and supported by the card holder 30 as a first support and the card holder 31 as a second support. The card holder 30 and the card holder 31 have the same shape, and a protrusion 36 of the card holder 31 is inserted into a grooved hole 34 of the card holder 30 and a protrusion 36 of the card holder 30 (not shown) is inserted into a grooved hole 34 (not shown) of the card holder 31 so as to support the substrate 20.

An elastic member mounting portion 32 and a concave portion 32a are formed to mount an elastic member for fixing the radiation detector 1 by pressing against a radiation detector supporting base when the radiation detector 1 is inserted into the radiation detector supporting base for supporting the plural radiation detectors 1. The radiation detector supporting base has a connector into which a card edge 29 is inserted. The card edge 29 of the radiation detector 1 is inserted into the connector such that a pattern 29a thereof is electrically connected to the connector whereby it is electrically connected to a control circuit as external electrical circuit, an external power line, a ground line etc.

Referring to FIGS. 1A to 1C, the radiation detector 1 is further composed of a flexible substrate 40 having a wiring pattern (wherein electrode patterns on the surface of the CdTe elements 10 opposite the substrate 20 and wiring patterns of the flexible substrate 40 on the side of the CdTe elements 10 are not shown) for electrically connecting electrode patterns on the CdTe elements 10 to plural substrate terminals 22 on the side of the pair of CdTe elements 10 opposite the substrate 20.

The flexible substrates 40 are each disposed on one side of the pair of CdTe elements 10 and on the other side of the pair of CdTe elements 10. In this embodiment, the flexible substrates 40 are each disposed on one side of the four pairs of CdTe elements 10 and on the other side of the four pair of CdTe elements 10. One end of the wiring patterns on the flexible substrate 40 is electrically connected to each of the substrate terminals 22 at each of connection portions 38 as a flexible lead connection portion of the card holder 30 and the card holder 31. For example, one end of the wiring patterns on the flexible substrate 40 is electrically connected by a conductive adhesive etc. to an element surface 10a of the CdTe element 10, and the other end of the wiring patterns is electrically connected by a conductive adhesive etc. to a terminal surface 22a of the substrate terminals 22.

In this embodiment, of the pair of CdTe elements 10, one CdTe element 10 as a first semiconductor element is fixed to one surface of the substrate 20, and provided with an electrode pattern as a first element electrode on the opposite surface to its surface on which it is fixed to the substrate 20. In like manner, the other CdTe element 10 as a second semiconductor element is fixed to the other surface of the substrate 20, and provided with an electrode pattern as a second element electrode on the opposite surface to its surface on which it is fixed to the substrate 20.

Then, the flexible substrate 40 as a first flexible substrate with a first wiring pattern connected to the electrode pattern of the one CdTe element 10 is disposed to cover the surface of the one CdTe element 10 and a part of the card holder 30. In other words, the flexible substrate 40 as the first flexible substrate is disposed such that one end of the wiring pattern is connected to the electrode pattern of the one CdTe element 10, the other end of the wiring pattern is electrically connected to the substrate terminals 22 at the connection portion 38, and it covers the periphery of the connection portion 38 as the flexible lead connection portion.

In like manner, the flexible substrate 40 as a second flexible substrate with a first wiring pattern connected to the electrode pattern of the other CdTe element 10 is disposed to cover the surface of the other CdTe element 10 and a part of the card holder 31. In other words, the flexible substrate 40 as the second flexible substrate is disposed such that one end of the wiring pattern is connected to the electrode pattern of the other CdTe element 10, the other end of the wiring pattern is electrically connected to the substrate terminals 22 at the connection portion 38, and it covers the periphery of the connection portion 38 as the flexible lead connection portion.

Figure 2A:
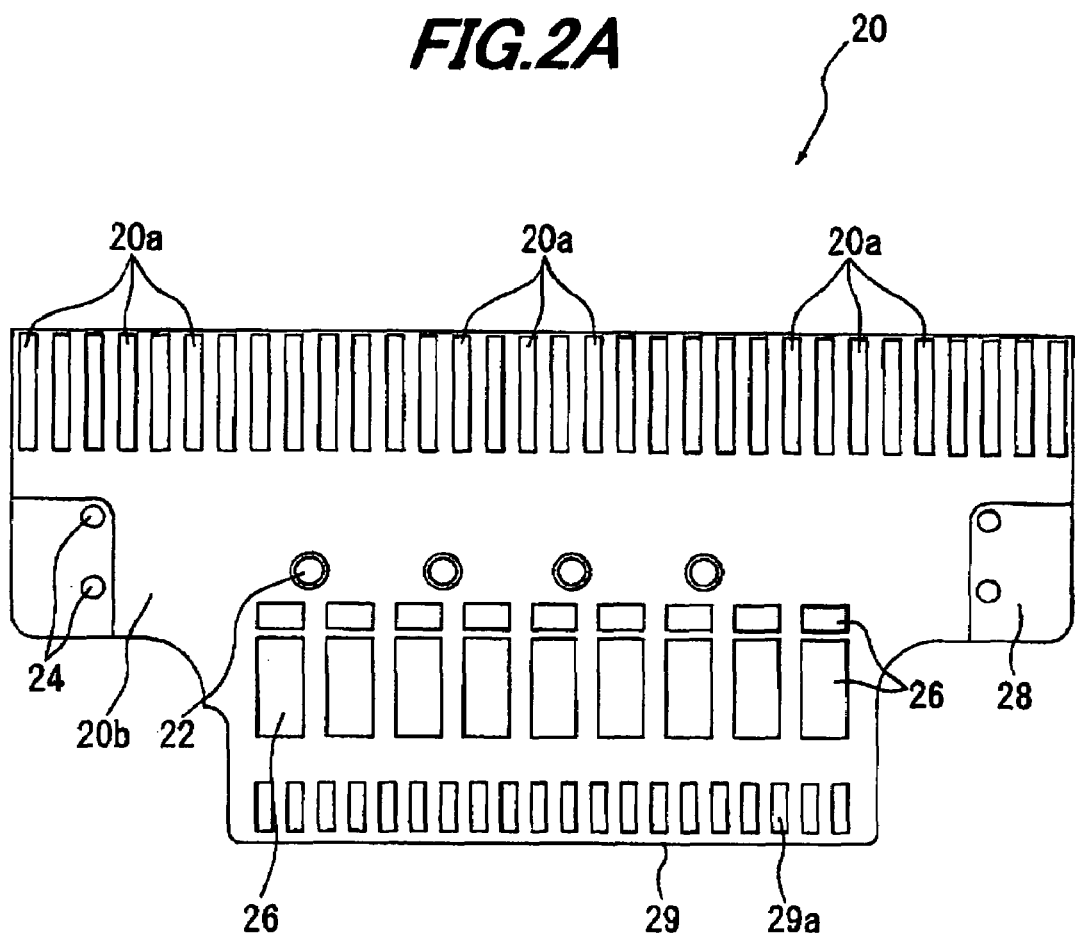
FIG. 2A is a front view showing a substrate of the embodiment.
Figure 2B:
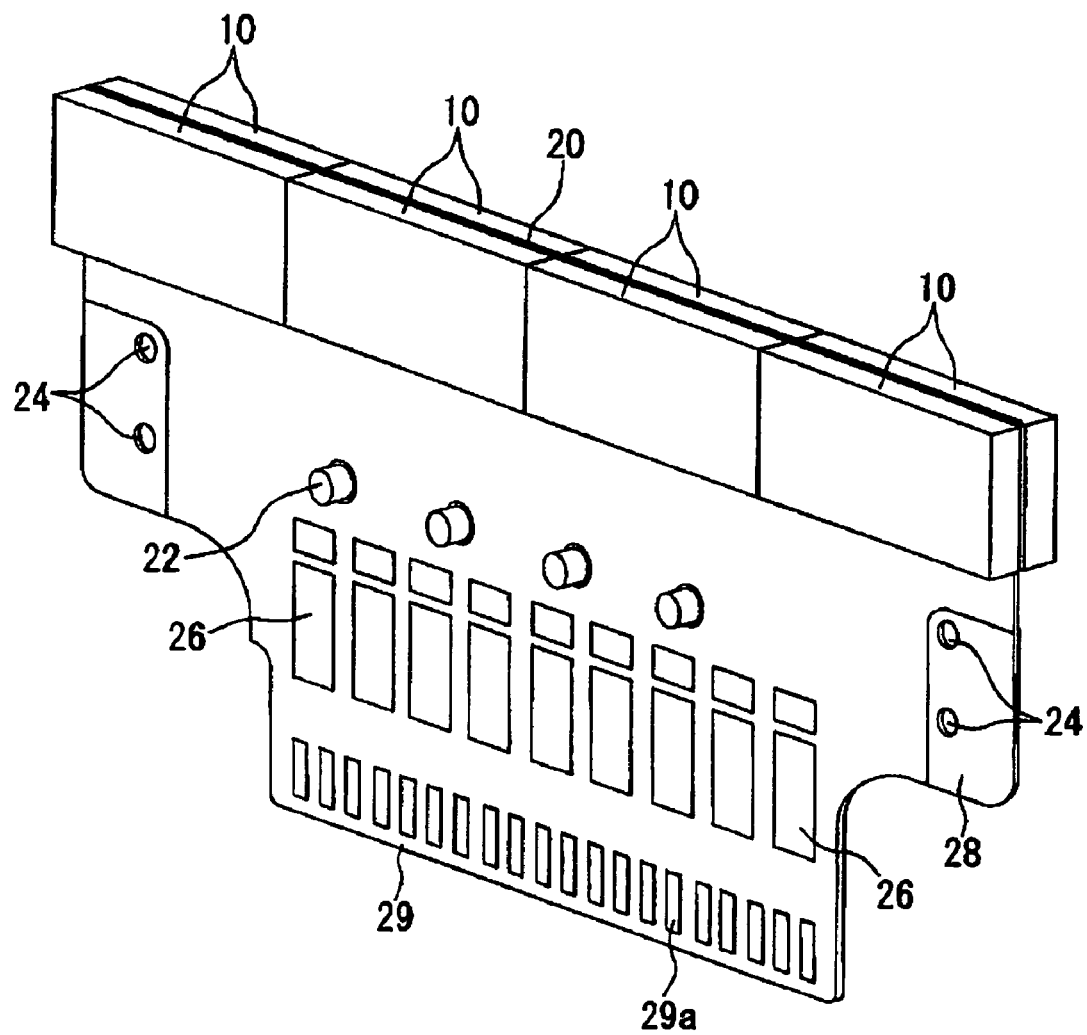
FIG. 2B is a perspective view showing the substrate of the embodiment with plural CdTe elements mounted thereon.

FIG. 2A is a front view showing a substrate of the embodiment. FIG. 2B is a perspective view showing the substrate of the embodiment with plural CdTe elements mounted thereon.

Details of Substrate 20

The substrate 20 of the embodiment is constructed such that a thin substrate (e.g., a glass epoxy substrate such as FR4) with a conductive film (e.g., copper foil) of a conductive material such as a metal conductor formed thereon is sandwiched by insulating layers 20b of an insulating material such as a solder resist. The substrate 20 has some flexibility and substantially the same thickness as or a thickness less than a wall for separating the apertures of the collimator. For example, the apertures of the collimator are formed nearly rectangular. The aperture size is 1.2 mm on a side, and the apertures are each arrayed at 1.4 mm pitch like a matrix. Thus, the thickness of a wall separating one aperture from the adjacent aperture is 0.2 mm. In this embodiment, the substrate 20 has substantially the same thickness (i.e., about 0.2 mm) as or a thickness less than the thickness of a wall for separating the apertures of the collimator.

The substrate 20 is shaped such that the width on the first end side where the plural CdTe elements 10 are mounted is wider than the width on the second end side opposite the first end side. On the second end side, the substrate 20 is supported by the card holder 30 and the card holder 31. On the first end side, plural element connecting portions 20a are provided for electrical connection with the CdTe elements 10. On the second end side, the card edge 29 is provided which has the plural patterns 29a for electrical connection between the radiation detector 1 and the external control circuit. Between the element connecting portion 20a and the card edge 29, plural electronic parts mounting portions 26 are provided which mount electronic parts such as a resister, a capacitor etc, electrically connected to the CdTe elements 10. The electronic parts mounting portions 26 may mount ASIC (Application Specific Integrated Circuit), FPGA (Field Programmable Gate Array) etc.

For example, the substrate 20 may have a length of about 40 mm in the longitudinal direction (or in the width direction). The substrate 20 may have a length of 20 mm in the lateral direction from the wide end to the narrow end, i.e., from the first end with the element connecting portion 20a to the second end with the card edge 29.

The substrate 20 is further provided with the columnar substrate terminals 22, which protrudes from the surface of the substrate 20 in the normal direction thereof, between the element connection portion 20a and the electronic parts mounting portions 26. For example, in this embodiment, the four columnar substrate terminals 22 are on the surface of the substrate 20. The substrate terminal 22 may be a column rectangular in cross section. The substrate 20 is further provided with a ground 28 at a corner of the wide region, and plural through-holes 24 for inserting the protrusions 36 of the card holder 30 and the card holder 31 thereinto are formed in the region of the ground 28.

The element connecting portions 20a, the substrate terminals 22, the electronic parts mounting portions 26, the ground 28 and the patterns 29a are formed on one surface and the other surface of the substrate 20 such that they are each plane-symmetrical with respect to the conductive film at the center of the substrate 20 in the thickness direction. Also, the element connecting portions 20a, the electronic parts mounting portions 26, the ground 28 and the patterns 29a are formed on one surface and the other surface of the substrate 20 such that they are each plane-symmetrical with respect to the substrate 20. The substrate terminals 22 are formed zigzag between one surface and the other surface of the substrate 20. The grounds 28 are formed by removing the insulating layer 20b on the conductive film to expose the conductive film therein.

Details of CdTe Elements 10

By mounting the CdTe elements 10 on the element connecting portions 20a as shown in FIG. 2A, the substrate 20 with the CdTe elements 10 mounted thereon is produced as shown in FIG. 2B. For example, the CdTe elements 10 are fixed to the substrate 20 by a conductive adhesive such as Ag paste applied on the element connecting portions 20a. In this embodiment, one radiation detector 1 is provided with the eight CdTe elements 10 where the four CdTe elements 10 are each fixed on one surface and the other surface of the substrate 20.

The CdTe elements 10 are formed nearly rectangular, and provided with electrode patterns (not shown) on the surface facing the element connecting portions 20a and on the opposite surface not facing the element connecting portions 20a. A radiation is inputted through the end face of the CdTe elements 10 and propagates toward the card edge 29 in the CdTe elements 10. The electrode patterns on the opposite surface are electrically connected to the wiring patterns on the flexible substrate 40. Although in this embodiment the CdTe elements 10 are used to detect the radiation, the semiconductor element is not limited to the CdTe elements 10 insofar as it can detect a radiation such as γ-ray. For example, as the semiconductor element, a compound semiconductor element such as a CdZnTe (CZT) element and an $HgI_2$ element may be used.

Figure 3:
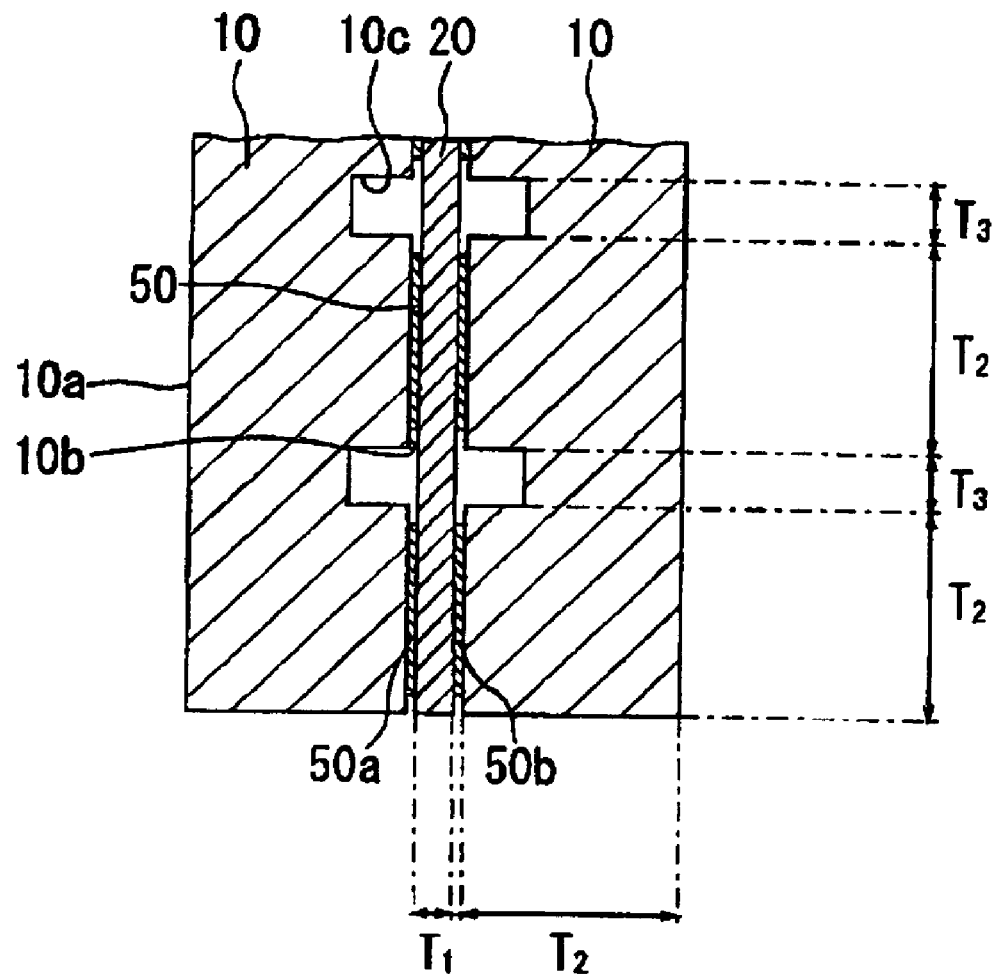
FIG. 3 is a schematic enlarged cross sectional view (cut in the horizontal direction) showing a part of the substrate of the embodiment with plural CdTe elements mounted thereon.

FIG. 3 is a schematic enlarged cross sectional view (cut in the horizontal direction) showing a part of the substrate of the embodiment with plural CdTe elements mounted thereon.

In this embodiment, the CdTe elements 10 are mounted respectively on one surface and the other surface of the substrate 20. The CdTe elements 10 are each provided with electrode patterns (not shown) for connecting the wiring patterns on the flexible substrate 40 on the element surface 10a, and plural grooves 10c on the element surface 10b on the side of the substrate 20. The CdTe elements 10 are each provided with electrode patterns (not shown) for connecting the element connecting portions 20a of the substrate 20 on the element surface 10b and between the grooves 10c.

The grooves 10c of the CdTe element 10 are nearly at equal intervals on the element surface 10b. For example, the CdTe element 10 has the seven grooves 10c. Each region of the CdTe element 10 separated by the grooves 10c corresponds to one pixel for detecting a radiation. Thus, the CdTe element 10 has multiple pixels. If the CdTe element 10 has the eight pixels, the radiation detector 1 has 64-pixel resolution. By increasing or decreasing the number of the grooves 10c, the number of the pixels in the CdTe element 10 increases or decreases.

The CdTe elements 10 are fixed to the element connecting portions 20a of the substrate 20 by the conductive adhesive 50. In this embodiment, one pixel of one CdTe element 10 is electrically connected via a conduction part (not shown) penetrating through the substrate 20 to one pixel of the other CdTe element 10 which is disposed plane-symmetrical with respect to the one pixel of the substrate 20 as a symmetry plane, while the pixels are fixed to the substrate 20 by conductive adhesives 50*a*, 50*b*.

The thickness $T_1$ of the substrate 20 is not more than 0.3 mm, preferably 0.2 mm, and the width $T_3$ of the groove 10*c* is, e.g., 0.2 mm. The thickness $T_2$ of the CdTe element 10 is, e.g., 1.2 mm. As shown in FIG. 3, the width of one pixel is also $T_2$ which is equal to the thickness $T_2$ of the CdTe element 10. Thus, one pixel is formed nearly square (in top view) with one corner lacking at the groove 10*c*. In this embodiment, the width of the groove 10*c* in each of the CdTe elements 10 can be determined, e.g., according to the aperture size of the collimator or the thickness of the wall separating the apertures thereof.

Details of Flexible Substrate 40

Figure 4:
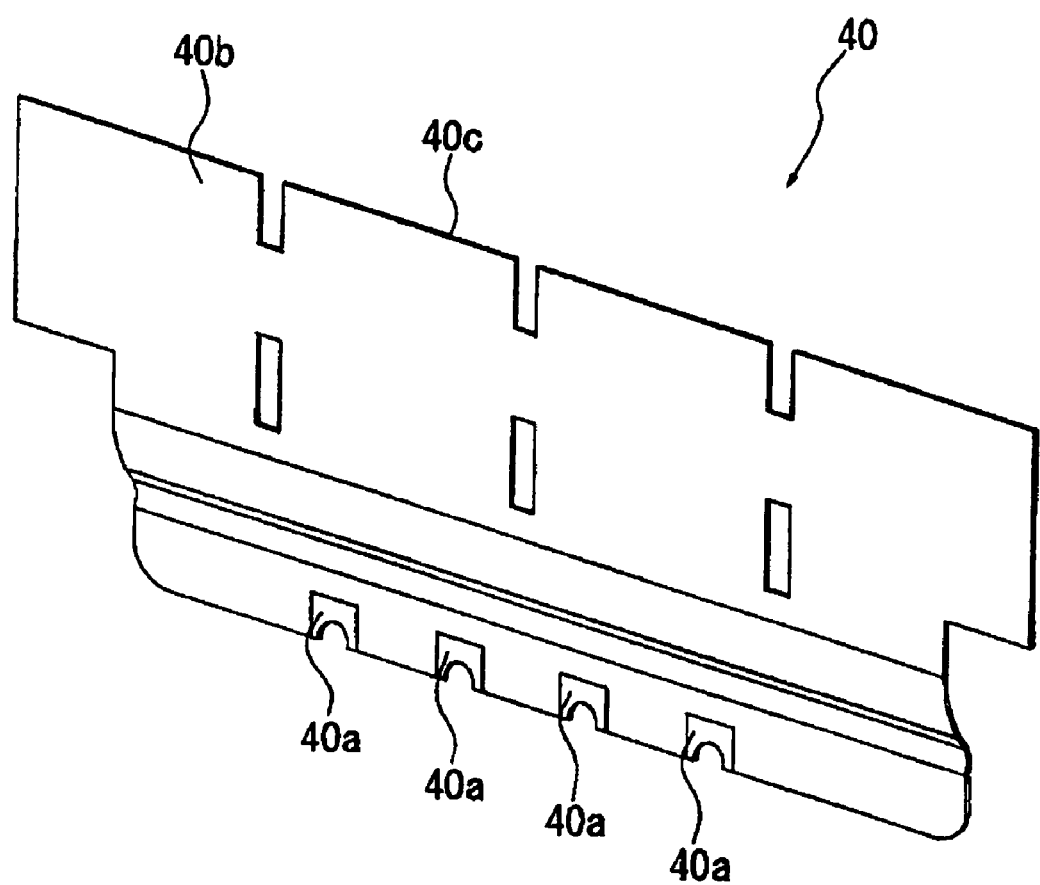
FIG. 4 is a perspective view showing the flexible substrate of the embodiment.

FIG. 4 is a perspective view showing the flexible substrate of the embodiment.

The flexible substrate 40 of the embodiment is composed of a base film having a flexibility and formed of an electrical insulating material, a wiring pattern formed at a predetermined position on the surface of the base film, and an insulating film covering the wiring pattern while allowing exposure of a part of the wiring pattern. A surface 40*b* of the flexible substrate 40 is all covered with the insulating material. On a back surface 40*c* of the flexible substrate 40, the wiring pattern is exposed in a region electrically connected to the CdTe elements 10.

The base film may be formed of polyimide etc. The insulating film may be formed of polyimide, solder resist etc. The wiring pattern may be formed of, e.g., a copper foil with a thickness of tens of micrometers.

The flexible substrate 40 is formed such that the width on the first end side on which the CdTe elements 10 are mounted is greater than that on the second end side opposite the first end side. On the narrower second end side of the flexible substrate 40, connection regions 40*a* are formed which are connected to the connection portion 38 of the card holder 30 and card holder 31.

Details of Card Holder 30 and Card Holder 31

Figure 5A:
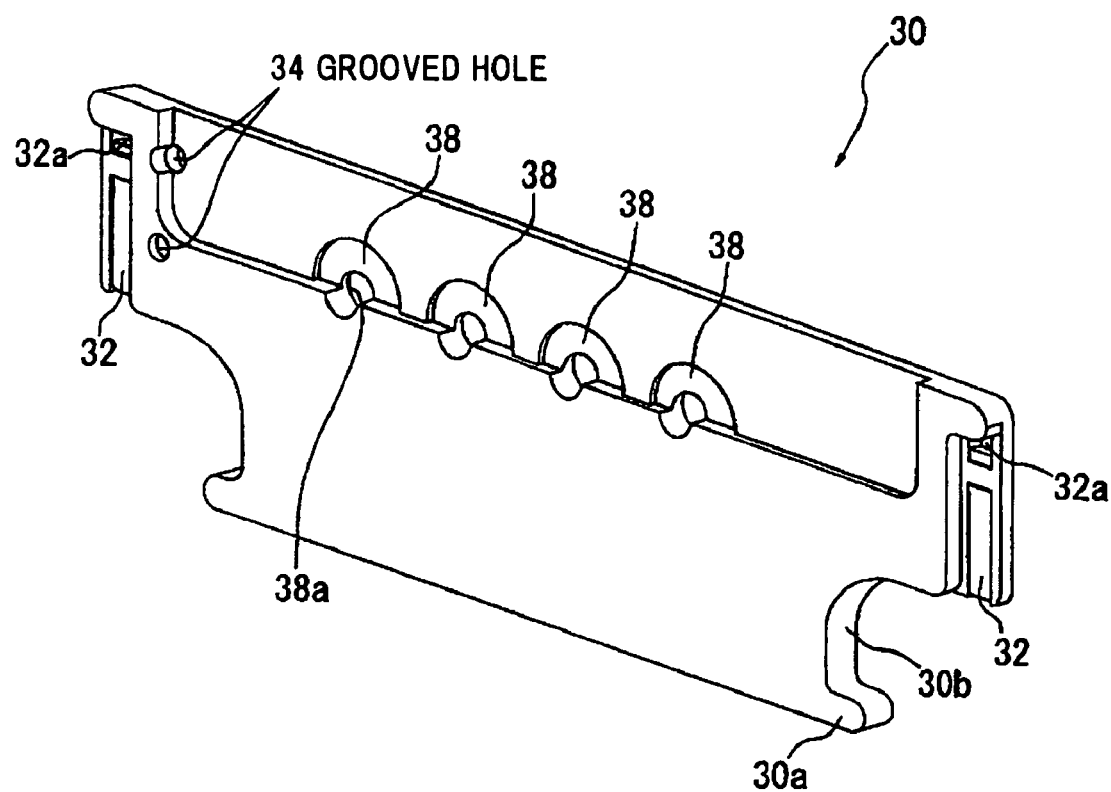
FIG. 5A is a perspective view (viewed from the front side) showing a card holder of the embodiment.

FIG. 5A is a perspective view (viewed from the front side) showing a card holder of the embodiment. FIG. 5B is a perspective view (viewed from the back side) showing the card holder of the embodiment.

Since the card holder 30 and the card holder 31 of the embodiment have the same shape, only the card holder 30 will be explained below.

As shown in FIG. 5A, the card holder 30 is composed of the elastic member mounting portion 32 and the concave portion 32*a* for securing an elastic member, the plural grooved holes 34 for inserting the protrusions 36 of the card holder 31 disposed opposite the card holder 30 thereinto, the plural connection portions 38 for connecting the wiring patterns of the flexible substrate 40 thereto, and terminal holes 38*a* for inserting the substrate terminals 22 of the substrate 20 thereinto. The card holder 30 is further composed of protrusions 30*a* and notched portions 30*b* on both sides and at the lower end thereof provided that the CdTe elements 10 are disposed at the upper end thereof.

As shown in FIG. 5B, the card holder 30 is further composed of the protrusions 36 for fitting the grooved holes 34 on the card holder 31 therewith on the back surface thereof. The card holder 30 is further composed of a recess 39 corresponding to the electronic parts mounting portions 26 of the substrate 20. By having the recess 39, electronic parts mounted on the electronic parts mounting portions 26 are covered with the card holder 30 or 31 such that they can be protected from contacting those on the adjacent radiation detector 1.

In the embodiment, the elastic member mounting portion 32 and the concave portion 32*a* are formed at both ends of the card holder 30 in the longitudinal direction. The connection portions 38 and the terminal holes 38*a* are formed corresponding to the substrate terminals 22 on the substrate 20 nearly at the middle region of the card holder 30. The grooved holes 34 are formed between the elastic member mounting portion 32 and the connection portions 38 and at a position nearer to the elastic member mounting portion 32 than one of the connection portions 38 nearest to the elastic member mounting portion 32. The card holders 30 and 31 are formed of an insulating resin material.

Details of Grooved Hole 34 and Protrusion 36

Figure 6:
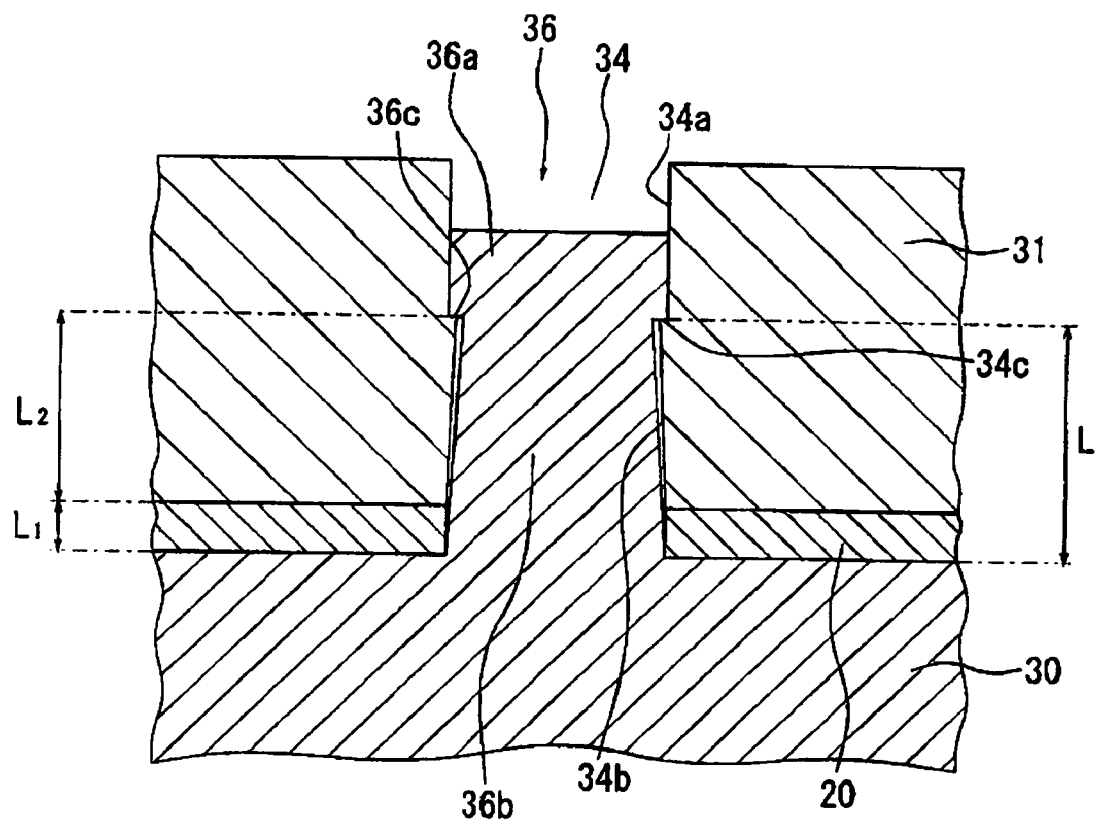
FIG. 6 is a schematic enlarged cross sectional view (cut in the horizontal direction) showing a part of the card holder of the embodiment where a protrusion thereof is inserted into a grooved hole of an adjacent card holder.

FIG. 6 is a schematic enlarged cross sectional view (cut in the horizontal direction) showing a part of the card holder of the embodiment where a protrusion thereof is inserted into a grooved hole of an adjacent card holder.

The substrate 20 of the embodiment is sandwiched and supported between the card holder 30 and the card holder 31. In this case, the card holder 30 and the card holder 31 are mutually engaged and fixed by inserting the protrusion 36 into the corresponding grooved hole 34. For example, the protrusions 36 on the card holder 30 are inserted through the through-holes 24 of the substrate 20 into the grooved holes 34 of the card holder 31. In like manner, the protrusions 36 on the card holder 31 are inserted through the through-holes 24 of the substrate 20 into the grooved holes 34 of the card holder 30.

By inserting the protrusion 36 into the corresponding grooved hole 34 to secure the card holder 30 and the card holder 31, compression force is applied to the substrate 20 from the card holder 30 and the card holder 31. Owing to the compression force, the bend of the substrate 20 is restricted such that the substrate 20 with the CdTe elements 10 mounted thereon can be supported by the card holder 30 and the card holder 31. In the embodiment, the through-holes 24 are formed at a part of the substrate 20 exposed by removing the insulating layer 20*b* such as solder resist, and the exposed part is compressed and supported by the card holder 30 and the card holder 31. Therefore, the substrate 20 can be supported with high positional precision between the card holder 30 and the card holder 31 without being affected by the low-precision thickness of the insulating layer 20*b* such as solder resist. Thus, in case of arranging the plural radiation detectors 1 on the radiation detector supporting base, the positional precision of one radiation detector 1 with respect to the other radiation detector 1 can be enhanced.

Referring to FIG. 6, the protrusion 36 of the embodiment is composed of a column part 36*b*, and a tip portion 36*a* extending from the top of the column part 36*b* and with a diameter greater than that of the column part 36*b* at least at the connection portion to the column part 36*b*. The column part 36*b* may be formed such that its diameter lowers gradually toward the tip portion 36*a* and it has nearly the same diameter as the tip portion 36*a* at the connection portion to the card holder 30. A step portion 36*c* is formed at the boundary of the column part 36*b* and the tip portion 36*a*.

The grooved hole 34 is composed of an opening region 34*b* with an inside diameter greater than the diameter of the column part 36*b* and smaller than the diameter of the tip portion 36*a*, and a stepped portion 34*a* with an inside diameter greater than the diameter of the tip portion 36*a* and fitted with the tip portion 36*a*. The inside diameter of the opening region 34*b* may be formed such that it lowers gradually toward the stepped portion 34*a* to correspond to the diameter of the column part 36*b*. A step portion 34*c* is formed at the boundary of the stepped portion 34*a* and the opening region 34*b*.

In this embodiment, by inserting the protrusion 36 into the grooved hole 34, the tip portion 36a of the protrusion 36 is fitted with the stepped portion 34a to fix the card holder 30 and the card holder 31 to each other. Here, the protrusion 36 and the grooved hole 34 are formed to meet the relationship of $L<L_1+L_2$ where L is the height of the column part 36b, $L_1$ is the thickness of the substrate 20, and $L_2$ is the depth of the opening region 34b. In case of meeting the relationship, compression force can be applied to the substrate 20 sandwiched between the card holder 30 and the card holder 31.

Figure 7A:
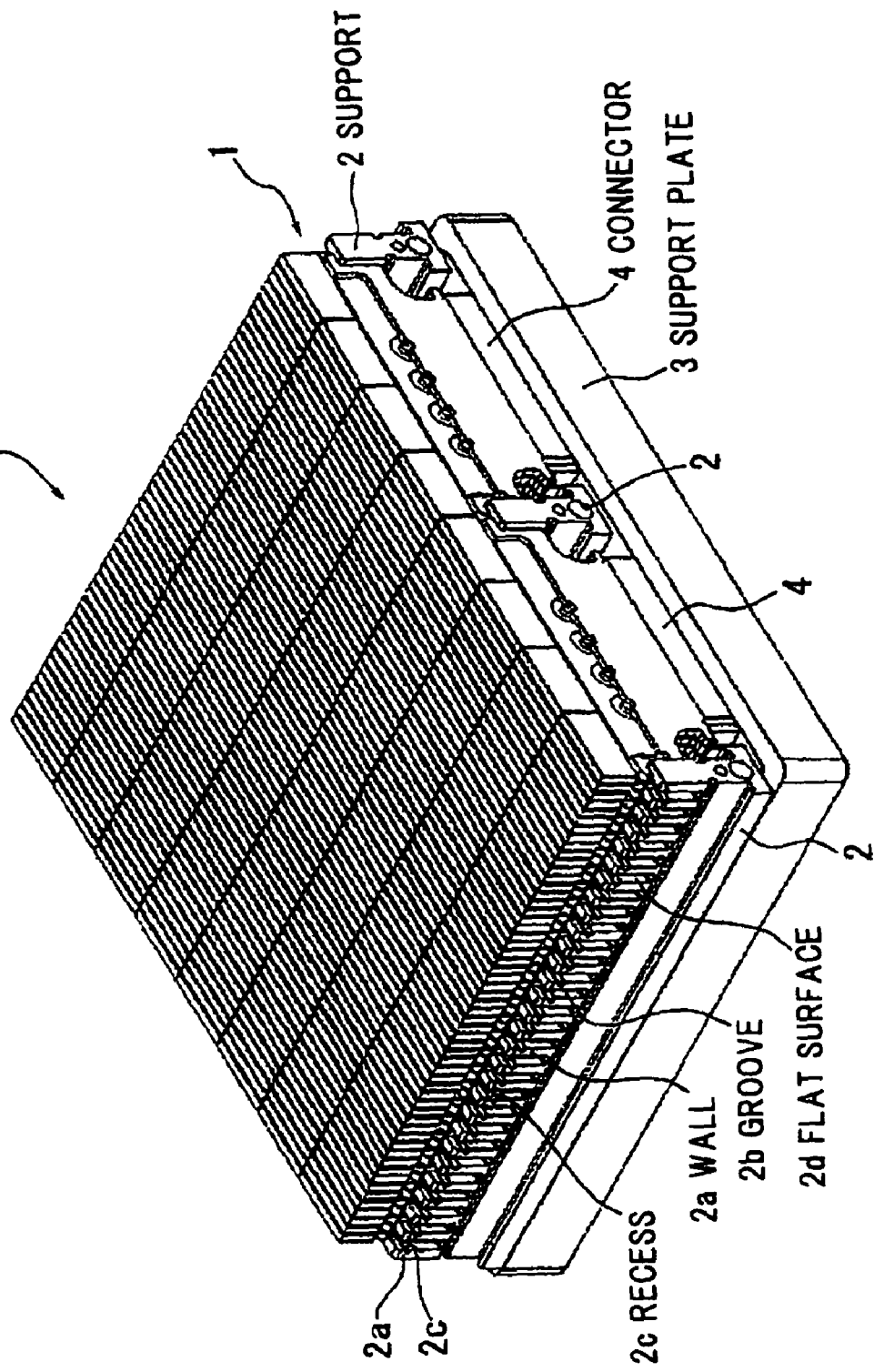
FIG. 7A is a perspective view showing an edge-on type radiation detector assembly with the plural radiation detectors of the embodiment arrayed.
Figure 7B:
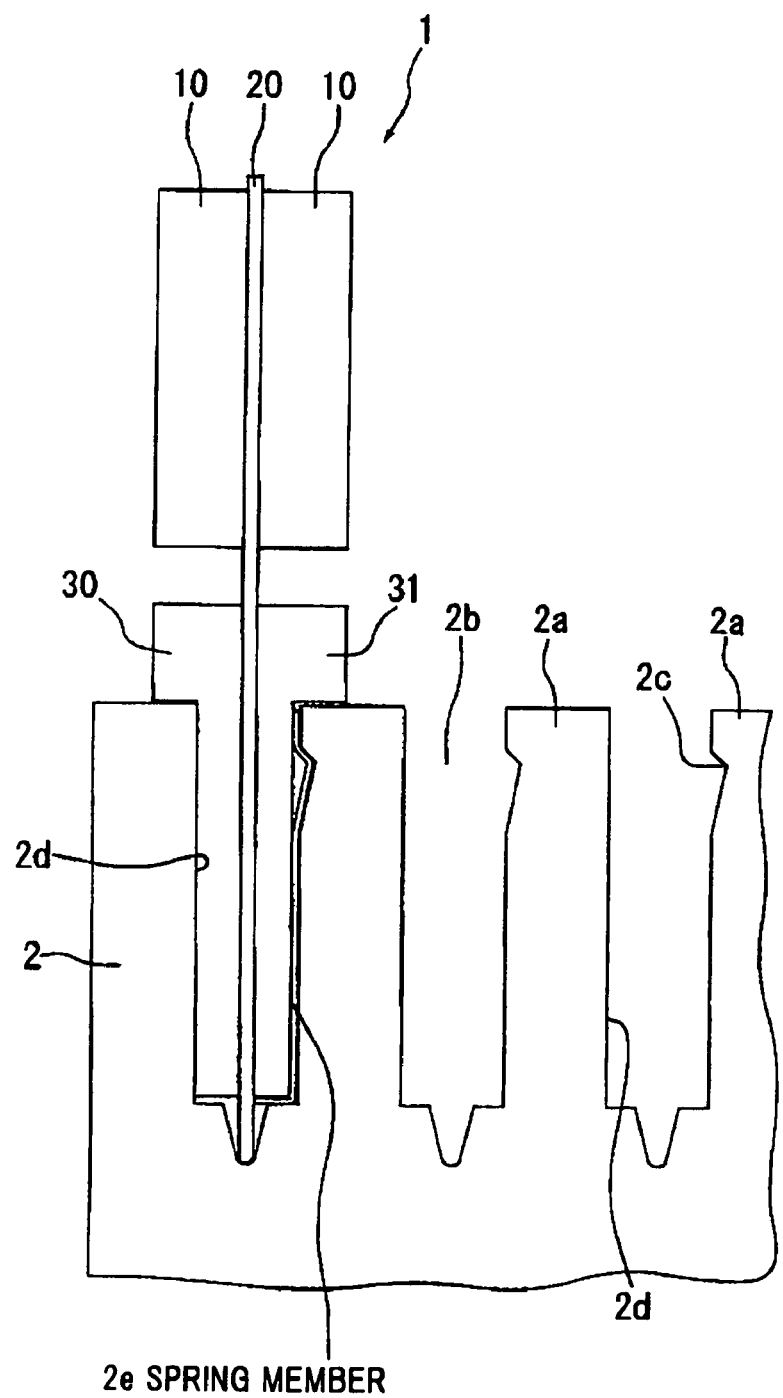
FIG. 7B is a schematic side view showing a support of a radiation detector supporting base.

FIG. 7A is a perspective view showing an edge-on type radiation detector assembly with the plural radiation detectors of the embodiment arrayed. FIG. 7B is a schematic side view showing a support of a radiation detector supporting base.

The radiation detector 1 of the embodiment is used for a radiation detector assembly 5 where the plural radiation detectors 1 are supported and held by the radiation detector supporting base. For example, the radiation detector supporting base is composed of plural supports 2 that are each arranged at intervals predetermined according to spacing for arranging the plural radiation detectors 1 and provided with plural grooves for inserting the plural radiation detectors 1 thereinto, a support plate 3 for mounting the supports 2, plural connectors 4 for connecting the radiation detectors 1 to the external control circuit by inserting the card edge 29 of the plural radiation detectors 1. As shown in FIG. 7A, the radiation detector assembly 5 is assembled such that the plural radiation detectors 1 of the embodiment are inserted into the corresponding grooves 2b of the support 2 and fixed thereto.

The plural supports 2 are disposed at intervals corresponding to the width of the radiation detector 1 on the support plate 3. As shown in FIG. 7B, the supports 2 are each provided with plural walls 2a, and grooves 2b are formed between the walls 2a. The wall 2a is provided with a recess 2c formed on a surface thereof and a flat surface 2d is formed opposite the surface. The elastic member mounting portion 32 and the concave portion 32a of the radiation detector 1 are fitted with a spring member 2e formed of, e.g., a sheet metal. When the radiation detector 1 is inserted into the groove 2b of the support 2, the spring member 2e is engaged with the recess 2c and the radiation detector 1 is pressed against the flat surface 2d of the wall 2a by the spring member 2e such that the radiation detector 1 is fixed to the support 2. The plural supports 2 may be formed, e.g., by cutting a metal material. By cutting the metal material to form the support 2, the plural grooves 2b can be formed at least with a precision of about ±0.02 mm.

Although not shown in FIG. 7A, a collimator with plural apertures is disposed over the plural radiation detectors 1, i.e., opposite the support plate 3 of the radiation detector 1. The reason for using the collimator is as follows. Radiations scattered at detected sample are prevented from being inputted into the plural CdTe elements 10 such that only radiations in a specific direction can be detected by the CdTe elements 10.

Figure 8:
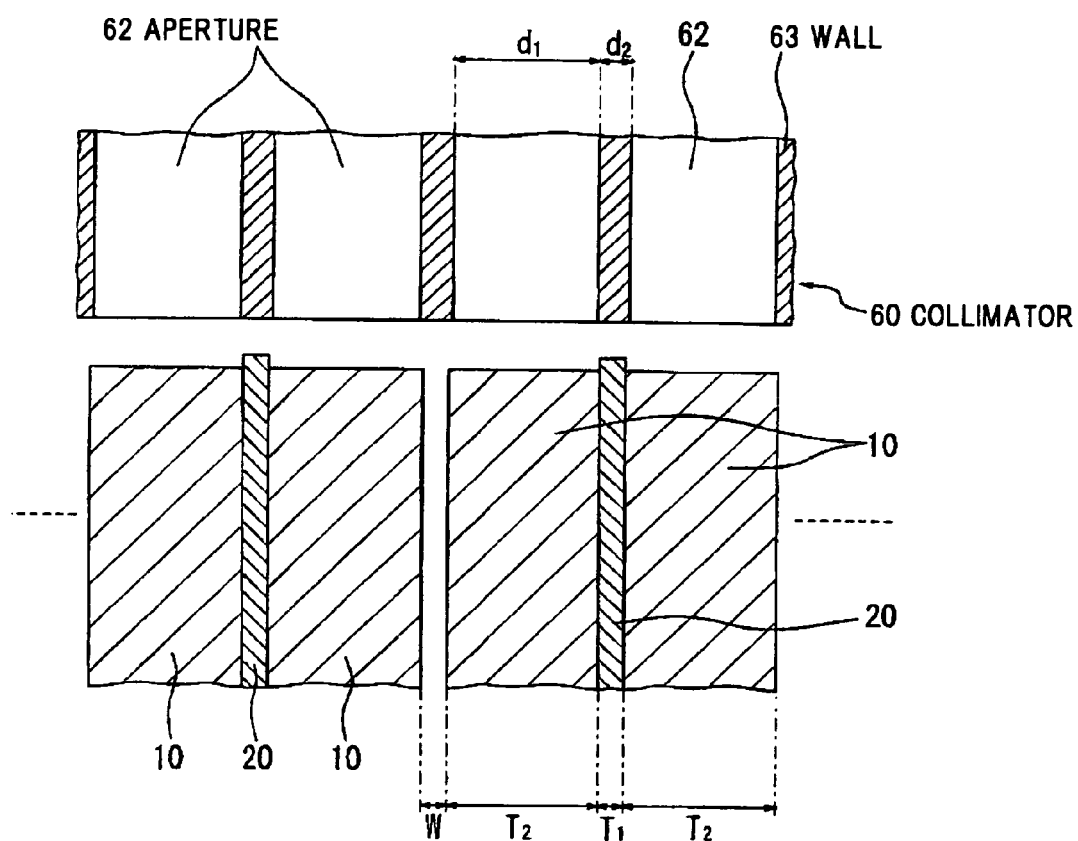
FIG. 8 is a schematic cross sectional view showing the radiation detectors of the embodiment with a collimator disposed thereon.

FIG. 8 is a schematic cross sectional view showing the radiation detectors of the embodiment with a collimator disposed thereon. For convenience of explanation, the flexible substrate is omitted in FIG. 8.

The collimator 60 is disposed to cover the radiation detectors 1. In case of using the collimator 60, each position of the apertures 62 of the collimator 60 is needed to correspond to each of the pixels of the CdTe elements 10. If the positional relationship deviates, a wall 63 (which is also called "partition wall" or "septum") separating the apertures 62 of the collimator 60 will be located in the pixel. In this case, due to the wall 63 over the pixel, the pixel cannot precisely detect a radiation.

Thus, it is required that high position precision of the radiation detectors 1 to the collimator 60 is provided by reducing the gap between the radiation detectors 1 so as to prevent the pixel of the CdTe elements 10 from being covered with the wall 63 of the collimator 60. When it is tried to enhance resolution by reducing the diameter $d_1$ of the apertures 62 of the collimator 60, the position precision is needed to be higher.

The radiation detector 1 of the embodiment is provided with the substrate 20 with substantially the same thickness as or a thickness less than the thickness $d_2$ of the wall 63 separating the apertures 62 of the collimator 60. Therefore, the gap W between the radiation detectors 1 can be set to be less than the thickness $d_2$ of the wall 63. By forming the groove 2b of the support 2 with a position precision corresponding to the gap W, the radiation detectors 1 can be densely arranged with high precision.

For example, where the thickness $T_1$ of the substrate 20 is 0.2 mm, the thickness $T_2$ of the CdTe element 10 is 1.2 mm and the gap W between the radiation detectors 1 is 0.2 mm, the radiation detectors 1 can be arranged at intervals of 2.8 mm. In this case, by defining the interval between the flat surface 2a of a wall 2a of the support 2 and the flat surface 2a of the adjacent wall 2a to be 2.8 mm, the radiation detectors 1 can be arranged with high precision.

Effects of the Embodiment

In the radiation detector 1 of the embodiment according to the invention, the electrode of the CdTe elements 10 on the opposite side to the substrate 20 is electrically connected to the substrate terminals 22 by the flexible substrate 40. Thus, the CdTe elements 10 each can be easily bonded to the wiring pattern of the flexible substrate 40 by a conductive adhesive. Only by pressing the region corresponding to the CdTe elements 10, all of the CdTe elements 10 and the wiring patterns can be properly connected while preventing variation in shape such as unevenness.

In the radiation detector 1 of the embodiment, the electrode pattern of the CdTe elements 10 is connected to the wiring pattern by using the excellent flexibility flexible substrate 40 not a poor flexibility material such as a sheet metal. Therefore, no excessive stress is applied to the CdTe elements 10 and mechanical stress can be protected from being applied to the CdTe elements 10.

The radiation detector 1 of the embodiment uses the substrate 20 with substantially the same thickness as or a thickness less than the thickness of the wall 63 separating the apertures 62 of the collimator 60, and the CdTe elements 10 thereof are fixed while sandwiching the substrate 20. Therefore, a part to which no radiation is inputted can be limited to the substrate 20, and the radiation detectors 1 can be arranged at a very narrow gap by using the thin substrate 20 such that the radiation detectors 1 can be in high density and precisely mounted on the radiation detector supporting base. Since the surface of the flexible substrate 40 is covered with the insulating material, insulation between the radiation detectors 1 can be secure when the plural radiation detectors 1 are mounted on the radiation detector supporting base.

In the radiation detector 1 of the embodiment, though it is difficult to mechanically hold the CdTe elements 10 by only the substrate 20, the radiation detector 1 can have a sufficient strength for handling since the substrate 20 is held by the card holder 30 and the card holder 31. Further, since the substrate 20 is held by the card holder 30 and the card holder 31, the radiation detector 1 can be handled without directly touching the CdTe elements 10 with his/her hand. Thus, the assembly workability can be enhanced upon inserting the radiation detectors 1 into the radiation detector supporting base.

In the radiation detector 1 of the embodiment, since the substrate 20 is supported by the card holder 30 and the card holder 31 while applying compression force to the substrate 20, the substrate 20 can be prevented from bending. Thus, the pixel of the CdTe element 10 can be prevented from deviating from the position of the aperture of the collimator due to the bending. Therefore, where the plural radiation detectors 1 are densely arranged, the position of one radiation detector 1 to the other radiation detector 1 can be controlled precisely.

In the radiation detector 1 of the embodiment, since the electronic parts on the electronic parts mounting portions 26 of the substrate 20 are covered by the card holder 30 and the card holder 31, the connection part between the electronic parts and the electronic parts mounting portions 26 can be protected. In the embodiment, since both the CdTe element 10 and the electronic parts are mounted on the substrate 20, the signal transmission line between the CdTe element 10 and the electronic parts can be shortened. In addition, since it is not necessary to mount the electronic parts on an external motherboard etc., the number of parts can be reduced and the entire radiation detector assembly 5 can be downsized.

In the radiation detector 1 of the embodiment, the plural semiconductor elements 10 and the plural electronic parts are mounted on the substrate 20, the substrate 20 is supported by the card holder 30 and the card holder 31, and the substrate 20 is provided with the preformed card edge 29. Therefore, the radiation detector 1 can be mounted on the radiation detector supporting base only by inserting the radiation detector 1 into the connector 4 of the radiation detector supporting base. Thus, it is not necessary to provide a connector with a complicated shape and the mounting can be simplified.

Modification

Figure 9:
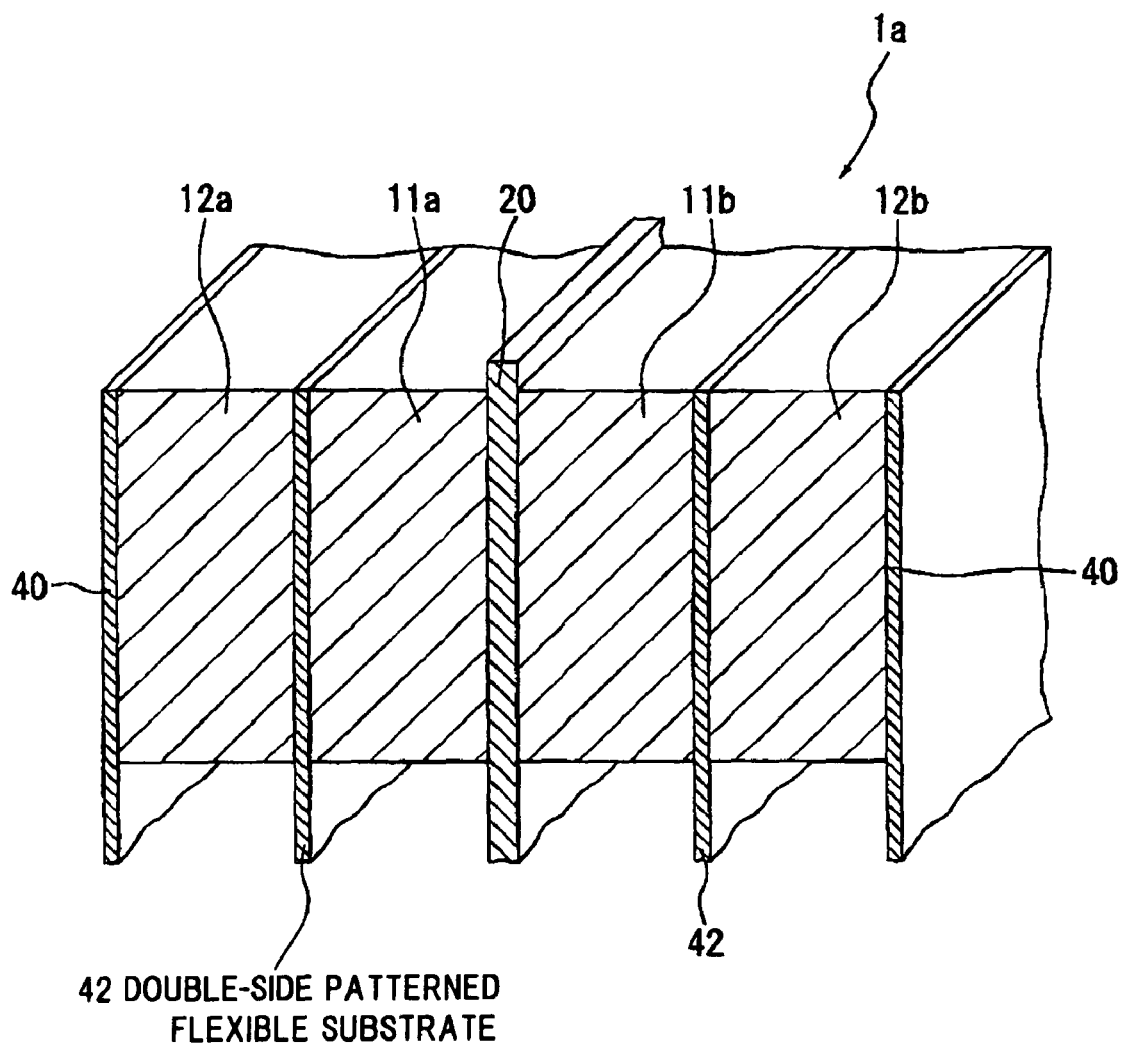
FIG. 9 is a schematic perspective view showing a radiation detector in modification according to the invention.

FIG. 9 is a schematic perspective view showing a radiation detector in modification of the embodiment according to the invention.

The radiation detector 1a in modification of the embodiment is constructed such that the CdTe elements 10 are stacked on one surface and the other surface of the substrate 20. For example, the radiation detector 1a is composed of, attached onto one surface of the substrate 20, a CdTe element 12a as a first semiconductor element and a CdTe element 11a as a third semiconductor element disposed between the CdTe element 12a and the substrate 20, and, attached onto the other surface of the substrate 20, a CdTe element 12b as a second semiconductor element and a CdTe element 11b as a fourth semiconductor element disposed between the CdTe element 12b and the substrate 20. The CdTe element 11a and the CdTe element 11b are fixed to the substrate 20 such that they are plane-symmetry with respect to the substrate 20.

The CdTe element 11a and the CdTe element 12a are fixed to each other via a double-side patterned flexible substrate 42 as a first double-side patterned flexible substrate with connection patterns formed on both sides thereof. Namely, the double-side patterned flexible substrate 42 has, formed at predetermined positions on the sides, a connection pattern for the CdTe element 11a and a connection pattern for the CdTe element 12a, such that the electrode pattern of the CdTe element 11a is connected to the connection pattern for the CdTe element 11a and the electrode pattern of the CdTe element 12a is connected to the connection pattern for the CdTe element 12a.

In like manner, the CdTe element 11b and the CdTe element 12b are fixed to each other via a double-side patterned flexible substrate 42 as a second double-side patterned flexible substrate with connection patterns formed on both sides thereof. Namely, the double-side patterned flexible substrate 42 has, formed at predetermined positions on the sides, a connection pattern for the CdTe element 11b and a connection pattern for the CdTe element 12b, such that the electrode pattern of the CdTe element 11b is connected to the connection pattern for the CdTe element 11b and the electrode pattern of the CdTe element 12b is connected to the connection pattern for the CdTe element 12b.

Thus, the radiation detector 1a in modification of the embodiment is constructed such that the CdTe elements 10 are stacked on one surface and the other surface of the substrate 20. Therefore, as compared to the case that a pair of CdTe elements 10 are fixed sandwiching the substrate 20 as in the radiation detector 1 of the above embodiment, for the radiation detector 1a, a region to which no radiation is inputted can be reduced by substantially a length corresponding to the thickness of the substrate 20.

Although the invention has been described with respect to the specific embodiments for complete and clear disclosure, the appended claims are not to be thus limited but are to be construed as embodying all modifications. It should be noted that all of the combinations of features as described in the embodiment is not always necessary.

What is claimed is:

1. A radiation detector, comprising:
   a semiconductor element capable of detecting a radiation, the semiconductor element comprising a first electrode pattern on a first surface and a second electrode pattern on a second surface, which is an opposite surface to the first surface;
   a substrate on which the semiconductor element is mounted, the substrate comprising an element connecting portion to be electrically connected to the first electrode pattern of the semiconductor element on a side of a first end, a card edge on a side of a second end opposite to the first end, and a substrate terminal; and
   a flexible substrate comprising a connection pattern,
   wherein the connection pattern of the flexible substrate is electrically connected to the second electrode pattern of the semiconductor element and is electrically connected to the substrate terminal of the substrate.

2. The radiation detector according to claim 1, wherein the flexible substrate further comprises a flexible base film, and an insulating film fanned on the base film, and
   wherein the connection pattern is formed between the base film and the insulating film.

3. The radiation detector according to claim 2, further comprising:
   an other semiconductor element disposed between the semiconductor element and the substrate and connected to one surface of the substrate.

4. The radiation detector according to claim 3, further comprising:
   a double-side patterned flexible substrate disposed between the semiconductor element and the other semiconductor element, the double-side patterned flexible substrate comprising connection patterns formed on both sides thereof and connected to the semiconductor element and the other semiconductor element, respectively.

5. The radiation detector according to claim 1, wherein the radiation detector is used for a radiation detector assembly that a plurality of the radiation detectors are arrayed.

6. The radiation detector according to claim 1, wherein the radiation detector comprises a plurality of semiconductor elements mounted on the substrate, and
wherein the plurality of semiconductor elements are arranged on one surface and an other surface of the substrate such that they are plane symmetrical with respect to the substrate.

7. The radiation detector according to claim 1, wherein the substrate has substantially a same thickness as or a thickness less than a thickness of a wall separating a plurality of apertures of a collimator.

8. The radiation detector according to claim 1, wherein the semiconductor element comprises a plurality of pixels for detecting the radiation.

9. A radiation detector, comprising:
a semiconductor element for detecting a radiation;
a substrate on which the semiconductor element is mounted; and
a flexible substrate comprising a connection pattern connected to an element electrode on an opposite side to the substrate of the semiconductor element,
wherein the semiconductor element is disposed on one surface of the substrate,
wherein the flexible substrate is disposed on the opposite side to the substrate of the semiconductor element, and
wherein another semiconductor element is disposed between the semiconductor element and the substrate and is connected to said one surface of the substrate.

10. A radiation detector, comprising:
a semiconductor element for detecting a radiation;
a substrate on which the semiconductor element is mounted; and
a flexible substrate comprising a connection pattern connected to an element electrode on an opposite side to the substrate of the semiconductor element,
wherein the semiconductor element is disposed on one surface of the substrate,
wherein the flexible substrate is disposed on the opposite side to the substrate of the semiconductor element,
wherein a double-side patterned flexible substrate is disposed between the semiconductor element and the other semiconductor element, the double-side patterned flexible substrate comprising connection patterns formed on both sides thereof and connected to the semiconductor element and the other semiconductor element, respectively, and
wherein another semiconductor element is disposed between the semiconductor element and the substrate and is connected to said one surface of the substrate.

* * * * *